United States Patent
Chang et al.

[11] Patent Number: 6,074,961
[45] Date of Patent: Jun. 13, 2000

[54] CARO'S CLEANING OF SOG CONTROL WAFER RESIDUE

[75] Inventors: Jieh-Ting Chang; Shiow-Shiang Lin, both of Hsin-Chu, Taiwan

[73] Assignee: Taiwan Semiconductor Manufacturing Company, Hsin-Chu, Taiwan

[21] Appl. No.: 09/099,143

[22] Filed: Jun. 18, 1998

[51] Int. Cl.⁷ .......................... H01L 21/302; B08B 3/14
[52] U.S. Cl. .......................... 438/756; 134/1.3; 438/906
[58] Field of Search ..................... 134/1.3, 1.2, 22.14; 458/723; 216/93; 427/240, 345; 438/756, 906

[56] References Cited

U.S. PATENT DOCUMENTS

| | | | |
|---|---|---|---|
| 4,465,549 | 8/1984 | Ritzman | 156/630 |
| 4,950,359 | 8/1990 | Parissis et al. | 216/86 |
| 5,486,266 | 1/1996 | Tsai et al. | 134/3 |
| 5,643,368 | 7/1997 | Nakashima | 134/1.3 |
| 5,656,097 | 8/1997 | Olesen et al. | 134/1 |
| 5,679,211 | 10/1997 | Huang | 156/643.1 |
| 5,747,381 | 5/1998 | Wu et al. | 438/624 |
| 5,814,186 | 9/1998 | Nguyen | 156/643.1 |
| 5,814,564 | 9/1998 | Yao et al. | 438/734 |
| 5,863,603 | 1/1999 | Sanhu et al. | 427/240 |

OTHER PUBLICATIONS

S.Wolf, Silicon Processing for the VLSI Era, vol. 1, Chapter 15: Wet Processing, pp. 515–517.

*Primary Examiner*—Benjamin L. Utech
*Assistant Examiner*—Donald L. Champagne
*Attorney, Agent, or Firm*—George O. Saile; Stephen B. Ackerman; Rosemary L.S. Pike

[57] ABSTRACT

A new method of recycling a spin-on-glass control wafer by removing spin-on-glass residue from the control wafer surface is described. A silicon control wafer is provided having a spin-on-glass layer coated thereon. The spin-on-glass layer is removed using a hydrofluoric acid dip wherein a silk-like spin-on-glass residue 15 remains on the silicon control wafer surface. The silicon control wafer surface is cleaned with a Caro's dip whereby the spin-on-glass residue is removed. Thereafter, the silicon control wafer can be reused.

17 Claims, 1 Drawing Sheet

CARO'S CLEANING OF SOG CONTROL WAFER RESIDUE

BACKGROUND OF THE INVENTION

(1) Field of the Invention

The invention relates to a method of removing spin-on-glass residue in the fabrication of integrated circuits, and more particularly, to a method of removing spin-on-glass residue on a control wafer after spin-on-glass removal in the manufacture of integrated circuits.

(2) Description of the Prior Art

In the manufacture of integrated circuit devices, control wafers are often used to test or to calibrate various production steps. The control wafers can be recycled and used again. For example, a control wafer may comprise a layer of siloxane spin-on-glass material overlying a silicon semiconductor substrate. To recycle the control wafer, the spin-on-glass layer is removed by dipping the wafer in a hydrofluoric acid (HF) solution. After the HF dip, a silk-like residue remains on the substrate surface. Further HF dip steps or plasma ashing cannot remove this residue resulting in the scrapping of the control wafer.

U.S. Pat. No. 5,679,211 to Huang discloses an oxygen-containing plasma treatment to remove a polymer formed on a spin-on-glass layer by the process of etching the spin-on-glass layer. U.S. Pat. No. 4,465,549 to Ritzman teaches the use of a Caro's acid cleaning to remove organic materials such as adhesive residue from a silicon wafer surface.

SUMMARY OF THE INVENTION

A principal object of the present invention is to provide an effective and very manufacturable method of recycling a spin-on-glass control wafer.

A further object of the invention is to provide a method for removing spin-on-glass residue from a control wafer.

A still further object of the invention is to provide a method for recycling a spin-on-glass control wafer by removing spin-on-glass residue from the control wafer surface.

Yet another object is to provide a method for recycling a spin-on-glass control wafer by using Caro's cleaning to remove spin-on-glass residue from the control wafer surface.

In accordance with the objects of this invention a new method of recycling a spin-on-glass control wafer by removing spin-on-glass residue from the control wafer surface is achieved. A silicon control wafer is provided having a spin-on-glass layer coated thereon. The spin-on-glass layer is removed using a hydrofluoric acid dip wherein a spin-on-glass residue remains on the silicon control wafer surface. The silicon control wafer surface is cleaned with a Caro's dip whereby the spin-on-glass residue is removed. Thereafter, the silicon control wafer can be reused.

BRIEF DESCRIPTION OF THE DRAWINGS

In the accompanying drawings forming a material part of this description, there is shown.

DESCRIPTION OF THE PREFERRED EMBODIMENTS

Figure 1:
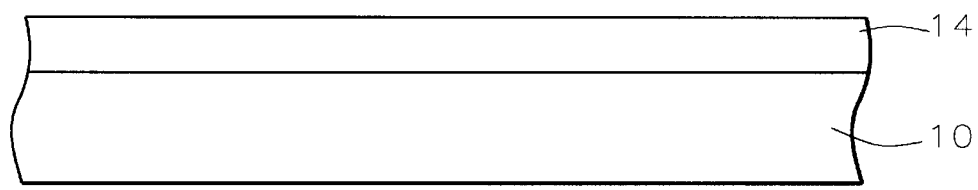
FIG. 1 schematically illustrates in cross-sectional representation a a control wafer to be recycled.

Referring now more particularly to FIG. 1, there is illustrated a portion of a control wafer. There is shown a semiconductor substrate 10, preferably composed of monocrystalline silicon. A layer of siloxane spin-on-glass (SOG) 14 is coated on the surface of the substrate to a typical thickness of between about 5000 and 10,000 Angstroms. The spin-on-glass layer is baked and cured as is conventional in the art. For example, the spin-on-glass layer is baked at a temperature of between about 150 and 250° C. for 2 to 5 minutes and then cured at a temperature of between about 300 and 420° C. for 60 to 150 minutes.

This completes fabrication of the control wafer. Now the control wafer is used to monitor the spin-on-glass thickness of a SOG coater or to monitor the spin-on-glass etch rate of an etch tool, for example.

After the job of the control wafer is finished, it is desirable to recycle the control wafer so that it can be used again, either in the same capacity or in another application. In order to recycle the control wafer, the spin-on-glass layer must be completely removed and the silicon surface cleaned.

Typically, the spin-on-glass layer 14 is removed using a hydrofluoric acid (HF) dip. The HF dip removes the spin-on-glass layer. For example, the HF solution has a ratio of HF to water of about 50:1. The temperature of the solution is about 22.5° C. The wafer is immersed in the dip for about 10 minutes.

Figure 2:
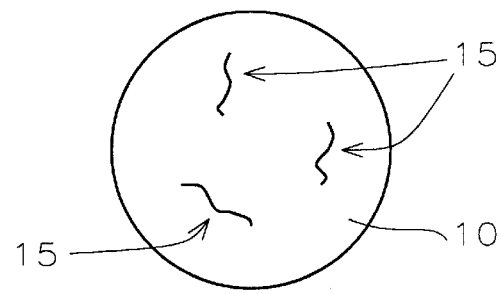
FIGS. 2 and 3 illustrate in top view of control wafer cleaned by the process of the present invention.

However, a silk-like residue remains on the wafer. This is illustrated in top view in FIG. 2. Silk-like residue 15 remains on the silicon surface 10. This residue cannot be removed by increasing the HF dip time nor can it be removed by plasma ashing. The residue may be a kind of organic compound and seems to be unique to the siloxane SOG control wafer.

Figure 3:
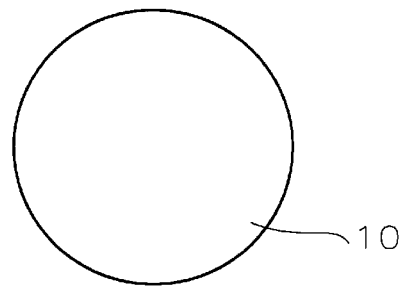

The inventors have discovered that the silk-like residue 15 can be removed by a Caro's cleaning step. Caro's cleaning is typically used as a photoresist strip for a non-metal wafer. In the process of the invention, the control wafer is dipped into a Caro's solution at a temperature of between about 125 and 135° C. for 8 to 16 minutes. The Caro's solution is composed of sulfuric acid ($H_2SO_4$) having a concentration of 95 to 98% and hydrogen peroxide ($H_2O_2$) having a concentration of 30 to 40%. The ratio of $H_2SO_4$ to $H_2O_2$ is 4 to 1. The Caro's dip removes all of the silk-like residue resulting in a clean silicon wafer surface, as illustrated in FIG. 3.

The control wafer is now clean and ready to be reused. The process of the present invention can be used to remove the silk-like spin-on-glass residue in any application in which there is no metal that would be attacked by the Caro's dip, such as in the control wafer described above.

The process of the present invention provides a simple and effective method of removing residue from a control wafer after spin-on-glass removal so that the control wafer can be recycled.

While the invention has been particularly shown and described with reference to the preferred embodiments thereof, it will be understood by those skilled in the art that various changes in form and details may be made without departing from the spirit and scope of the invention.

What is claimed is:

1. A method of removing a silk-like spin-on-glass residue from the surface of a silicon wafer comprising:

providing a silicon wafer having a spin-on-glass layer coated thereon;

removing said spin-on-glass layer using a hydrofluoric acid dip wherein said silk-like spin-on-glass residue remains on said silicon wafer surface; and cleaning said silicon wafer surface with a Caro's dip whereby said silk-like spin-on-glass residue is removed.

2. The method according to claim 1 wherein said spin-on-glass layer is a siloxane spin-on-glass.

3. The method according to claim 1 wherein said Caro's dip comprises $H_2SO_4$ and $H_2O_2$.

4. The method according to claim 1 wherein said Caro's dip comprises $H_2SO_4$ and $H_2O_2$ in a ratio of 4 to 1.

5. The method according to claim 1 wherein said Caro's dip comprises a solution of 95 to 98% $H_2SO_4$ and 30 to 40% $H_2O_2$ in a ratio of 4 to 1.

6. The method according to claim 1 wherein said step of cleaning said silicon wafer surface comprises dipping said wafer into said Caro's dip at a temperature of between about 125 and 135° C. for 8 to 16 minutes.

7. A method of recycling a silicon control wafer comprising:

providing said silicon control wafer having a spin-on-glass layer coated thereon;

removing said spin-on-glass layer using a hydrofluoric acid dip wherein a silk-like spin-on-glass residue remains on said silicon control wafer surface;

cleaning said silicon control wafer surface with a Caro's dip whereby said silk-like spin-on-glass residue is removed; and thereafter reusing said silicon control wafer.

8. The method according to claim 7 wherein said spin-on-glass layer is a siloxane spin-on-glass.

9. The method according to claim 7 wherein said Caro's dip comprises $H_2SO_4$ and $H_2O_2$.

10. The method according to claim 7 wherein said Caro's dip comprises $H_2SO_4$ and $H_2O_2$ in a ratio of 4 to 1.

11. The method according to claim 7 wherein said Caro's dip comprises a solution of 98% $H_2SO_4$ and 30 to 40% $H_2O_2$ in a ratio of 4 to 1.

12. The method according to claim 7 wherein said step of cleaning said silicon wafer surface comprises dipping said wafer into said Caro's dip at a temperature of between about 125 and 135° C. for 8 to 16 minutes.

13. A method of recycling a silicon control wafer comprising:

providing said silicon control wafer having a siloxane spin-on-glass layer coated thereon;

removing said siloxane spin-on-glass layer using a hydrofluoric acid dip wherein a silk-like spin-on-glass residue remains on said silicon control wafer surface;

cleaning said silicon control wafer surface with a Caro's dip whereby said silk-like spin-on-glass residue is removed; and thereafter reusing said silicon control wafer.

14. The method according to claim 13 wherein said Caro's dip comprises $H_2SO_4$ and $H_2O_2$.

15. The method according to claim 13 wherein said Caro's dip comprises $H_2SO_4$ and $H_2O_2$ in a ratio of 4 to 1.

16. The method according to claim 13 wherein said Caro's dip comprises a solution of 98% $H_2SO_4$ and 30 to 40% $H_2O_2$ in a ratio of 4 to 1.

17. The method according to claim 13 wherein said step of cleaning said silicon wafer surface comprises dipping said wafer into said Caro's dip at a temperature of between about 125 and 135° C. for 8 to 16 minutes.

* * * * *